(12) United States Patent
Okutani

(10) Patent No.: US 7,535,166 B2
(45) Date of Patent: May 19, 2009

(54) ORGANIC EL DISPLAY

(75) Inventor: Satoshi Okutani, Ishikawa-gun (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 258 days.

(21) Appl. No.: 11/669,997

(22) Filed: Feb. 1, 2007

(65) Prior Publication Data

US 2007/0126352 A1    Jun. 7, 2007

Related U.S. Application Data

(63) Continuation of application No. PCT/JP2005/017236, filed on Sep. 13, 2005.

(30) Foreign Application Priority Data

Sep. 22, 2004    (JP)    ............... 2004-276034

(51) Int. Cl.
*H01J 1/62* (2006.01)
*H01J 63/04* (2006.01)

(52) U.S. Cl. .............. 313/504; 313/501; 313/503; 313/506; 313/512

(58) Field of Classification Search .......... 313/498–512
See application file for complete search history.

(56) References Cited

U.S. PATENT DOCUMENTS

| 6,284,393 | B1 | 9/2001 | Hosokawa et al. | |
| 2005/0127824 | A1 | 6/2005 | Mori et al. | |
| 2005/0142379 | A1* | 6/2005 | Juni et al. | 428/690 |
| 2005/0194896 | A1* | 9/2005 | Sugita et al. | 313/506 |
| 2006/0066230 | A1* | 3/2006 | Kubota et al. | 313/506 |
| 2007/0013291 | A1* | 1/2007 | Cok et al. | 313/501 |

FOREIGN PATENT DOCUMENTS

| JP | 10-294182 A | 11/1998 |
| JP | 2003-234178 A | 8/2003 |
| JP | 2004-127740 A | 4/2004 |
| WO | WO 03/084291 A1 | 10/2003 |

* cited by examiner

*Primary Examiner*—Joseph L Williams
*Assistant Examiner*—Kevin Quarterman
(74) *Attorney, Agent, or Firm*—Oblon, Spivak, McClelland, Maier & Neustadt, P.C.

(57) ABSTRACT

An organic EL display includes an organic EL element which includes first and second electrodes and an active layer interposed therebetween and including an emitting layer, and an outcoupling layer facing the first electrode. The organic EL element forms a waveguide layer which includes the first electrode and the active layer and in which light components from the emitting layer propagate in an in-plane direction while causing multiple-beam interference. A distance between the outcoupling layer and the waveguide layer is shorter than a wavelength of light from the organic EL element. A guide length x, a number of reflection m, an absorption coefficient α, and an outcoupling efficiency β satisfy a relationship represented by an inequality:

$$\beta \sum_{M=1}^{m} \frac{(1-\beta)^{M-1}}{\exp\{\alpha(2M-1)x\}} > 0.1.$$

10 Claims, 3 Drawing Sheets

ORGANIC EL DISPLAY

CROSS-REFERENCE TO RELATED APPLICATIONS

This is a Continuation Application of PCT Application No. PCT/JP2005/017236, filed Sep. 13, 2005, which was published under PCT Article 21(2) in English.

This application is based upon and claims the benefit of priority from prior Japanese Patent Application No. 2004-276034, filed Sep. 22, 2004, the entire contents of which are incorporated herein by reference.

BACKGROUND OF THE INVENTION

1. Field of the Invention

The present invention relates to an organic electroluminescent (EL) display.

2. Description of the Related Art

Since organic EL displays are of self-emission type, they have a wide viewing angle and a high repose speed. In addition, they do not require a backlight, and therefore, low-profile and lightweight are possible. For these reasons, the organic EL displays are attracting attention as a display which substitutes the liquid crystal display.

An organic EL element, which is the main part of the organic EL displays, includes a light-transmitting front electrode, a light-reflecting or light-transmitting back electrode facing the front electrode, and an organic layer interposed between the electrodes and containing a light-emitting layer. The organic EL element is a charge-injection type light-emitting element which emits light when an electric current flows through the organic layer.

In the meantime, the luminance of the organic EL element increases with the magnitude of current flowing through the EL element. However, if the current density is increased, power consumption increases and the lifetime of the organic EL element is significantly reduced. Therefore, in order to achieve high luminance, low power consumption, and long lifetime, it is important to more efficiently extract the light emitted by the organic element from the organic EL display, i.e., to improve an outcoupling efficiency.

BRIEF SUMMARY OF THE INVENTION

An object of the present invention is to improve an outcoupling efficiency of an organic EL display.

According to an aspect of the present invention, there is provided an organic EL display comprising an organic EL element which comprises a first electrode, a second electrode facing the first electrode, and an active layer interposed between the first and second electrodes and including an emitting layer, and an outcoupling layer facing the first electrode, wherein the organic EL element forms a waveguide layer which includes the first electrode and the active layer and in which light components from the emitting layer propagate in an in-plane direction parallel to a main surface of the waveguide layer while causing multiple-beam interference, wherein a distance between the outcoupling layer and the waveguide layer is shorter than a wavelength of light from the organic EL element, and wherein a guide length x in μm calculated by using a following equation (1), a number of reflection m calculated by using a following equation (2), an absorption coefficient α in μm$^{-1}$ of the waveguide layer, and an outcoupling efficiency β of the outcoupling layer satisfy a relationship represented by a following inequality (3), where L is a thickness in pm of the waveguide layer, $\theta_i$ is an incident angle at which a light component with the highest intensity emitted by the emitting layer and propagating in the in-plane direction in the waveguide layer while causing multiple-beam interference is incident on a main surface of the waveguide layer facing the outcoupling layer, and the outcoupling efficiency β is a luminous energy ratio of a light component extracted from the waveguide layer with respect to an incident light for a single reflection of the light component with the highest intensity on the main surface of the waveguide layer facing the outcoupling layer.

$$x = \frac{L}{\cos\theta_i} \quad (1)$$

$$m = \frac{1}{2}\left(\frac{\ln 100}{\alpha x} + 1\right) \quad (2)$$

$$\beta \sum_{M=1}^{m} \frac{(1-\beta)^{M-1}}{\exp\{\alpha(2M-1)x\}} > 0.1 \quad (3)$$

DETAILED DESCRIPTION OF THE INVENTION

Figure 1:
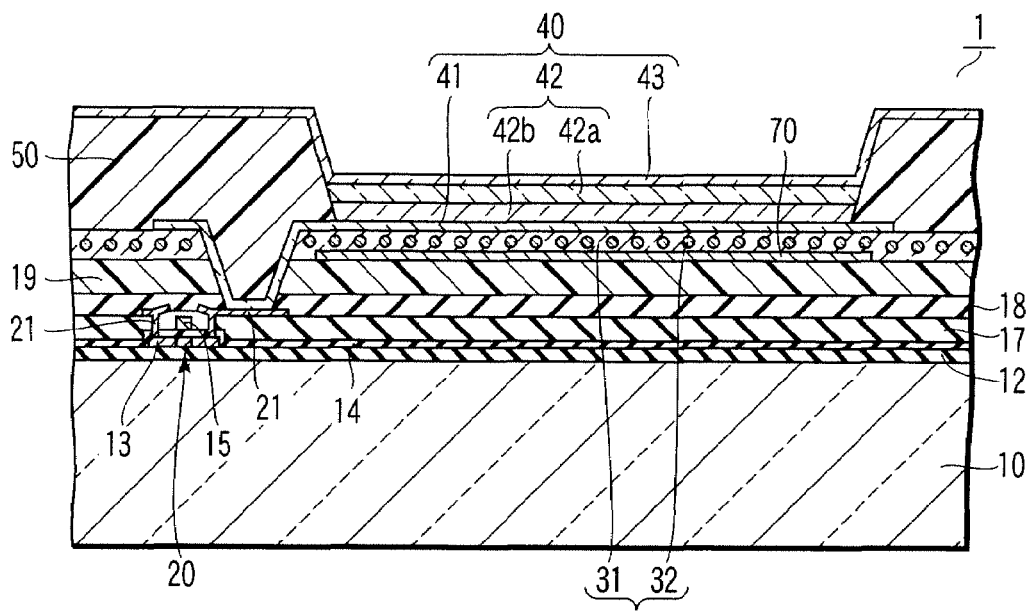
FIG. 1 is a sectional view schematically showing an organic EL display according to a first embodiment of the present invention.

An embodiment of the present invention will be described below in detail with reference to the accompanying drawings. The same reference numerals denote the same or similar constituent elements throughout the drawings, and a repetitive description thereof will be omitted.

FIG. 1 is a cross sectional view schematically showing an organic EL display according to an embodiment of the present invention. In FIG. 1, the organic EL display 1 is illustrated such that its display surface, that is, the front surface, faces downwardly and the back surface faces upwardly.

The organic EL display 1 is a top emission type organic EL display which employs an active matrix drive method. The organic EL display 1 includes an insulating substrate 10 such as a glass substrate.

On the transparent substrate 10, pixels are arranged in a matrix form. Each pixel includes a pixel circuit and an organic EL element 40.

The pixel circuit include, for example, a drive control element (not shown) and an output control switch 20 connected in series with the organic EL element 40 between a pair of power supply terminals, and pixel switch (not shown). The drive control element has a control terminal connected to a video signal line (not shown) via the pixel switch and outputs a current, whose magnitude corresponds to a video signal supplied from the video signal line, to the organic EL element 40 via the output control switch 20. A control switch of the pixel switch is connected to a scan signal line (not shown), and a switching operation of the control switch is controlled by a scan signal supplied from the scan signal line. Note that other structures can be employed for the pixels.

On the substrate 10, as an undercoat layer 12, for example, an $SiN_x$ layer and an $SiO_x$ layer are arranged in this order. A semiconductor layer 13 such as a polysilicon layer in which a channel, source and drain are formed, a gate insulator 14 which can be formed with use of, for example, TEOS (tetraethyl orthosilicate), and a gate electrode 15 made of, for example, MoW, are arranged in this order on the undercoat layer 12, and these layers form a top gate-type thin film transistor (referred to as a TFT hereinafter). In this example, the TFTs are used as TFTs of the pixel switch ST, output control switch and drive control element. Further, on the gate insulator 14, scan signal lines (not shown) which can be formed in the same step as that for the gate electrode 15 are arranged.

An interlayer insulating film 17 made of, for example, $SiO_x$ which is deposited by a plasma CVD method, covers the gate insulator 14 and gate electrode 15. Source and drain electrodes 21 are arranged on the interlayer insulating film 17, and they are buried in a passivation film 18 made of, for example, $SiN_x$. The source and drain electrodes 21 have, for example, a three-layer structure of Mo/Al/Mo, and electrically connected to the source and drain of the TFT via contact holes formed in the interlayer insulating film 17. Further, on the interlayer insulating film 17, video signal lines (not shown) which can be formed in the same step as that for the source and drain electrodes 21 are arranged.

A flattening layer 19 is formed on the passivation film 18. Reflection layers 70 are arranged on the flattening layer 19. A hard resin can be used as a material of the flattening layer 19, for example. A metal material such as Al, for example, can be used as a material of the reflection layer 70.

The flattening layer 19 and the reflection layer 70 are covered with an outcoupling layer 30. Here, as an example, the outcoupling layer 30 includes a first portion 31 with light-transmission property, and second portions 32 dispersed therein. For example, the second portions 32 have light-transmission property, and are different in refractive index from the first portion.

If an arrangement of the second portions 32 substantially forms a lattice when the outcoupling layer 30 is observed in a direction perpendicular to its film surface, the outcoupling layer 30 serves as a diffraction grating. Alternatively, if the second portions 32 are randomly arranged when the outcoupling layer 30 is observed in a direction perpendicular to that its film surface, the outcoupling layer 30 serves as a light-scattering layer.

The outcoupling layer 30 may not have a structure shown in FIG. 1. For example, the outcoupling layer 30 may be a film with light-transmission property which is provided with a number of recesses or protrusions on a main surface thereof.

On the outcoupling layer 30, first electrodes 41 with light-transmission property are arranged spaced apart from one another. Each first electrode 41 faces the reflection layer 70. In addition, each first electrode 41 is connected to a drain electrode 21 via through-holes formed in the passivation film 18, the flattening layer 19, and the outcoupling layer 30.

The first electrode 41 is an anode in this example. As a material of the first electrode 41, for example, a transparent conductive oxide such as an ITO (indium tin oxide) can be used.

A partition insulating layer 50 is placed on the outcoupling layer 30. In the partition insulating layer 50, through-holes are formed at positions corresponding to the first electrodes 41. The partition insulating layer 50 is an organic insulating layer, for example, and can be formed by using a photolithography technique.

An active layer 42 including a light-emitting layer 42a is placed on each first electrode 41 which is exposed to a space in the through-hole of the partition insulating layer 50. The light-emitting layer 42a is a thin film containing a luminescent organic compound which can generate a color of, for example, red, green or blue. The active layer 42 can further include a layer other than the light-emitting layer 42a. For example, the active layer 42 can further include a buffer layer 42b which serves to mediate the injection of holes from the front electrode 41 into the emitting layer 42a. The active layer 42 can further contain a hole transporting layer, a hole blocking layer, an electron transporting layer, an electron injection layer, etc.

The partition insulating layer 50 and the active layer 42 are covered with a second electrode 43 with light-transmission property. The second electrode 43 is a cathode which is continuously formed and common to all pixels. The second electrode 43 is electrically connected to an electrode wiring, the electrode wiring being formed on the layer on which video signal lines are formed, via contact holes (not shown) formed in the passivation film 18, the flattening layer 19, the outcoupling layer 30, and the partition insulating layer 50. Each organic EL element 40 includes the first electrode 41, active layer 42 and second electrode 43.

In general, the organic EL display 1 shown in FIG. 1 are sealed by glass sealing or protective film sealing in order to prevent the organic EL elements 40 from being deteriorated due to contact with moisture or oxygen and the like. In addition, in general, a polarizing plate is placed on the front side of the organic EL elements 40.

Although the organic EL display 1 shown in FIG. 1 is of top emission type, the organic EL display 1 may be of bottom emission type. For example, the reflection layer 70 may be omitted, and the second electrode 43 may have light-reflection property.

As described above, in the organic EL display 1, the outcoupling layer 30 is placed so as to be adjacent to the organic EL element 40. When such a structure is employed, as described below, the light emitted by the light emitting layer 42a of the organic EL element 40 can be extracted from the organic EL display 1 with higher efficiency.

A portion of the light components emitted by the light emitting layer 42a propagates in an in-plane direction while repeating reflection (reflection or total reflection) in a region including the first electrode 41 and the active layer 42 of the organic EL element 40, in this example, in a layered structure of the first electrode 41 and the active layer 42. That is, a portion of the light components emitted by the light emitting layer 42a propagates in the in-plane direction while repeating reflection in a waveguide layer which includes the first electrode 41 and the active layer 42. The light components propagating in the in-plane direction cannot be extracted from the waveguide layer if an incident angle on a main surface of the waveguide layer is great.

When the outcoupling layer 30 is placed adjacent to the organic EL element 40, a direction of the light emitted by the light emitting layer 42a can be changed. Thus, it becomes possible to extract the light components emitted by the light emitting layer 42a from the organic EL display 1 with higher efficiency.

As described above, when the outcoupling layer 30 is used, luminous efficiency of the organic EL display 1 can be improved. However, a portion of the light components propagating in the waveguide layer in the in-plane direction is absorbed by the waveguide layer itself.

Therefore, in the present embodiment, the organic EL display 1 is designed as follows. That is, firstly, a guide length x (μm) is calculated in accordance with the following equation (1), in which L is a thickness (μm) of the waveguide layer, and $\theta_i$ is an incident angle at which a light component with the highest intensity emitted by the emitting layer 42a and propagating in the in-plane direction in the waveguide layer while causing multiple-beam interference is incident on a main surface of the waveguide layer facing the outcoupling layer 30. Secondary, a number of reflection m is calculated in accordance with the following equation (2) using the guide length x (μm) and an absorption coefficient α (μm$_{-1}$) of the waveguide layer. Thirdly, the organic EL display is designed such that the number of reflection m, the absorption coefficient α (μm$_{-1}$), the guide length x (μm), and an outcoupling efficiency β of the outcoupling layer satisfy a relationship represented by the following inequality (3), where the outcoupling efficiency β is a luminous energy ratio of a light component extracted from the waveguide layer with respect to an incident light for a single reflection of the light component with the highest intensity on the main surface of the waveguide layer facing the outcoupling layer 30.

$$x = \frac{L}{\cos\theta_i} \quad (1)$$

$$m = \frac{1}{2}\left(\frac{\ln 100}{\alpha x} + 1\right) \quad (2)$$

$$\beta \sum_{M=1}^{m} \frac{(1-\beta)^{M-1}}{\exp\{\alpha(2M-1)x\}} > 0.1 \quad (3)$$

The outcoupling efficiency β and the number of reflection m will be described with reference to FIGS. 2 and 3.

Figure 2:
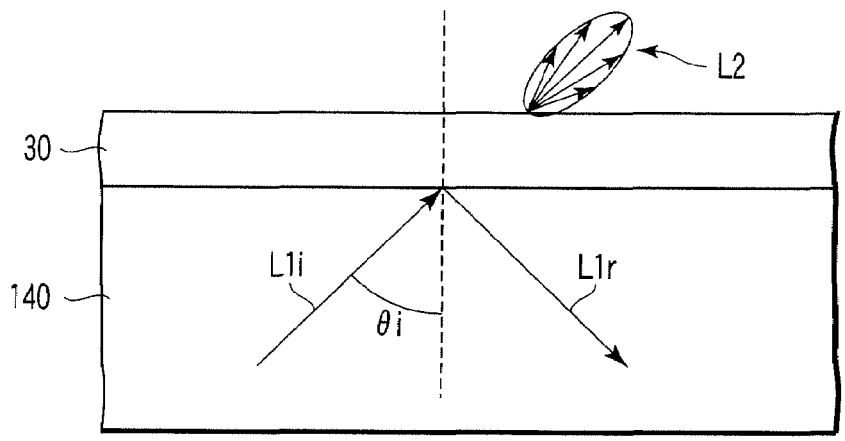
FIG. 2 is a view schematically showing how an outcoupling layer extracts light from a waveguide layer, in which the light propagates in an in-plane direction while causing multi-beam interference, to the atmosphere.

FIG. 2 is a view schematically showing how an outcoupling layer extracts light from a waveguide layer, in which the light propagates in an in-plane direction while causing multibeam interference, to the atmosphere.

In FIG. 2, a layered structure of the first electrode 41 and the active layer 42 is defined as a waveguide layer 140. In addition, in FIG. 2, L1$_i$ and L1$_r$ indicate light with the highest intensity propagating in the in-plane direction in the waveguide layer 140 while causing multiple-beam interference, and L2 indicates the light extracted from the waveguide layer 140 through the outcoupling layer 30 to the atmosphere when the light L1$_i$ is incident on an interface between the waveguide layer and the outcoupling layer.

When the light L1$_i$ is incident on the interface between the waveguide layer 140 and the outcoupling layer 30, a portion of the light is extracted from the waveguide layer 140 to the atmosphere as light L2, and another portion is reflected as L1$_r$. The outcoupling efficiency β is a value calculated from the following equation (4) concerning the light L1$_i$ and the light L2.

$$\beta = \frac{\int_0^{2\pi}\int_0^{\pi/2} i(\theta,\phi)d\theta d\phi}{I_0} \quad (4)$$

In equation (4) above, $I_0$ indicates a luminous energy of incident light L1$_i$. In addition, i(θ,φ) indicates a luminous energy of light components of the light L2 which travel in a direction defined by a polar angle θ and a cone angle φ when the polar axis is parallel to the film surface.

Figure 3:
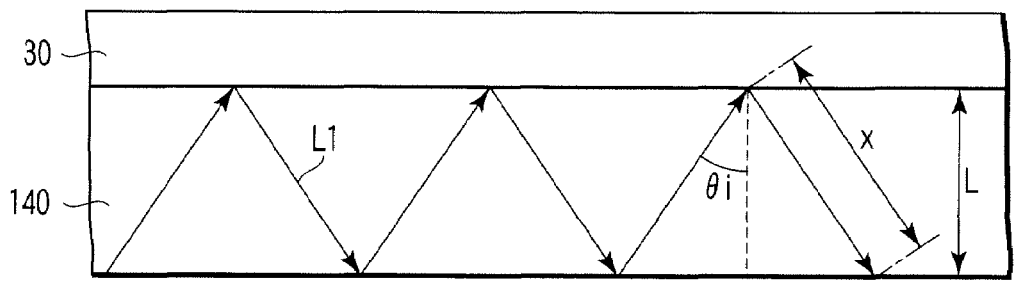
FIG. 3 is a view schematically showing how the light propagates in the waveguide layer in the in-plane direction while causing multi-beam interference.

FIG. 3 is a view schematically showing how the light propagates in the waveguide layer in the in-plane direction while causing multi-beam interference. In FIG. 3, L1 indicates a light component with the highest intensity of the light propagating in the in-plane direction while causing multiple-beam interference in the waveguide layer 140.

As shown in FIG. 3, the guide distance x (μm) is a length of a line segment which is parallel to the traveling direction of the light L1 and extends from one main surface to the other main surface of the waveguide layer 140. In the case of ignoring decrease in luminous energy of the light L1 due to reflection, a luminous energy $I1_M$ of the light L1 reflected M times on the interface between the waveguide layer 140 and the outcoupling layer 30 can be calculated from the following equation (5), in which M is a number of reflection of the light L1 on the interface between the waveguide layer 140 and the outcoupling layer 30, α (μm$^{-1}$) is an absorption coefficient of the waveguide layer 140 concerning the light L1, and $I_0$ is an initial luminous energy of the light L1.

$$I1_M = \frac{I_0}{\exp\{\alpha(2M-1)x\}} \quad (5)$$

A number of reflection m corresponds to the number M in the equation (5) when the luminous energy $I1_M$ is one hundredth of the luminous energy $I_0$. That is, the number of reflection m is a total number of reflection on the interface between the waveguide layer 140 and the outcoupling layer 30 until the luminous energy of the light L1 is decreased to one hundredth of the initial luminous energy.

Figure 4:
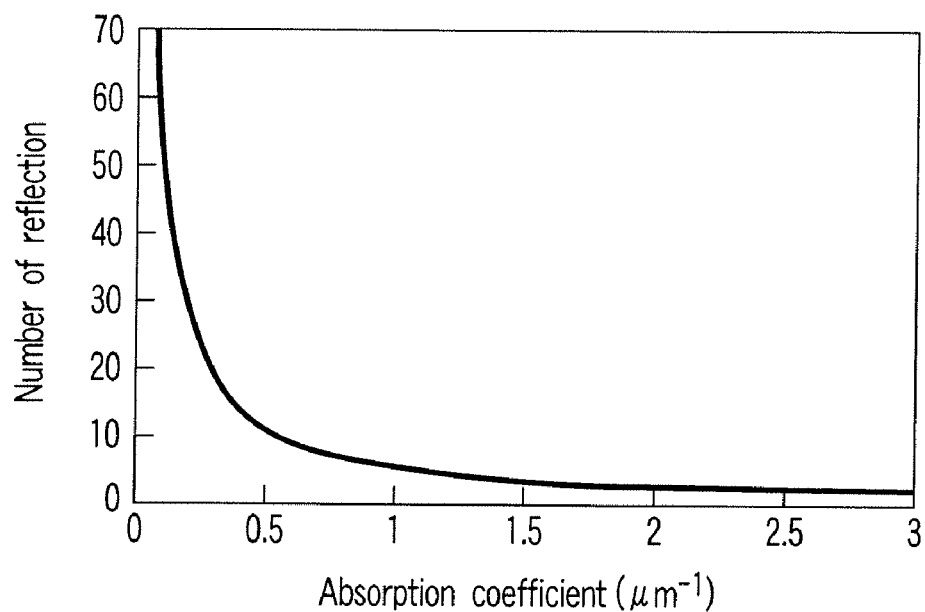
FIG. 4 is a graph showing an example of a relationship between an absorption coefficient of the waveguide layer and a number of reflection.

FIG. 4 is a graph showing an example of a relationship between the absorption coefficient α of the waveguide layer and the number of reflection m. In the figure, the abscissa indicates the absorption coefficient α, and the ordinate indicates the number of reflection m.

FIG. 4 shows data in the case where the thickness L of the waveguide layer is 0.21 μm, and an incident angle $\theta_i$ is 60°. As shown in FIG. 4, in the case where the absorption coefficient α is 0.5 μm$^{-1}$, the number of reflection m is 12.

Based on the foregoing, the luminous energy $I2_M$ of the light L2 extracted from the waveguide layer 140 to the atmosphere at the time of an M-th reflection of the light L1 on the interface between the waveguide layer 140 and the outcoupling layer 30 can be calculated from the following equation (6).

$$I2_M = \frac{I_0\beta(1-\beta)^{M-1}}{\exp\{\alpha(2M-1)x\}} \quad (6)$$

Therefore, a total luminous energy $\Sigma I2_M$ of the light L2 extracted from the waveguide layer 140 to the atmosphere when the light L1 is reflected n-times on the interface between the waveguide layer 140 and the outcoupling layer 30 can be calculated from the following equation (7).

$$\sum_{M=1}^{n} I2_M = I_0 \beta \sum_{M=1}^{n} \frac{(1-\beta)^{M-1}}{\exp\{\alpha(2M-1)x\}} \quad (7)$$

Therefore, a ratio of the total luminous energy $\Sigma I2_M$ of the light L2 when the light L1 is reflected n-times on the interface between the waveguide layer 140 and the outcoupling layer 30 with respect to the initial luminous energy $I_0$, i.e., the outcoupling efficiency, $\Sigma I2_M/I_0$ can be calculated from the following equation (8).

$$\sum_{M=1}^{n} I2_M/I_0 = \beta \sum_{M=1}^{n} \frac{(1-\beta)^{M-1}}{\exp\{\alpha(2M-1)x\}} \quad (8)$$

Figure 5:
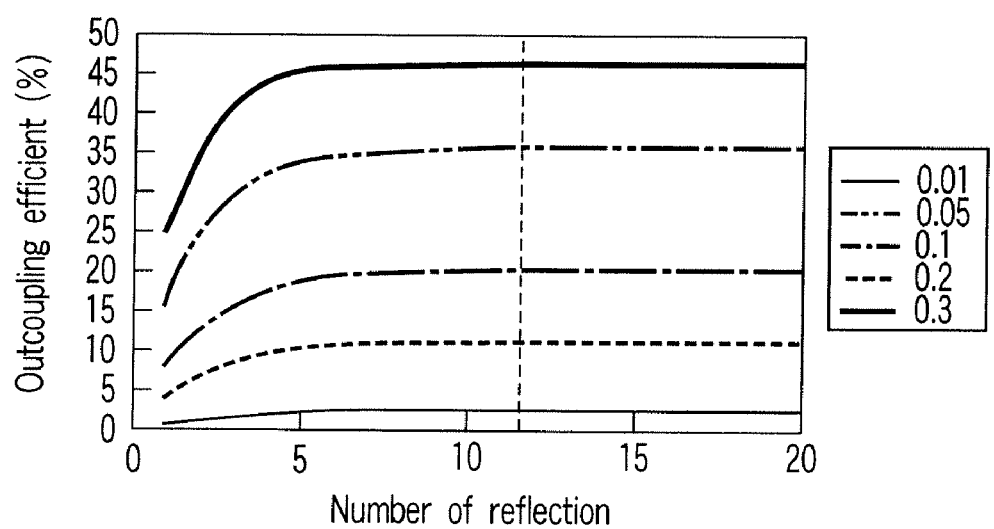
FIG. 5 is a graph showing examples of a relationship between a number of reflection and an outcoupling efficiency.

FIG. 5 is a graph showing examples of a relationship between the number of reflection n and the outcoupling efficiency $\Sigma I2_M/I_0$. In the figure, the abscissa indicates the number of reflection n, and the ordinate indicates the outcoupling efficiency $\Sigma I2_M/I_0$. In addition, FIG. 5 shows data in the case where the thickness L of the waveguide layer is 0.21 μm, an incident angle $\theta_i$ is 60°, an absorption coefficient α is 0.5 μm$^{-1}$, and outcoupling efficiency β is 0.01, 0.05, 0.1, 0.2, or 0.3.

As shown in FIG. 5, a change in the outcoupling ratio $\Sigma I2_M/I_0$ in accordance with an increase of the number of reflection n is slowed down when the number of reflection n is 5 or more, and substantially saturates when the number of reflection n is about 12.

In addition, as the outcoupling efficiency β increases, the outcoupling ratio $\Sigma I2_M/I_0$ also increases. In particular, in the case where the outcoupling efficiency β is 0.05 or more, if the number of reflection n is 5 or more, an outcoupling ratio $\Sigma I2_M/I_0$ of 10% or more can be achieved.

As is evident from the foregoing, when the organic EL display 1 is designed so as to meet the relationship represented by the inequality (3), it becomes possible to more efficiently extract the light propagating in the in-plane direction from the waveguide layer 140. That is, the light outcoupling efficiency of the organic EL display 1 can be improved.

Although the foregoing description considers only attenuation of light L1 due to absorption of the waveguide layer 140, in actuality, the light L1 is attenuated by being reflected on the interface between the waveguide layer 140 and the second electrode 43. When attenuation of the light L1 caused by reflection on this interface is restricted, the outcoupling efficiency of the organic EL display 1 can be further improved.

Figure 6:
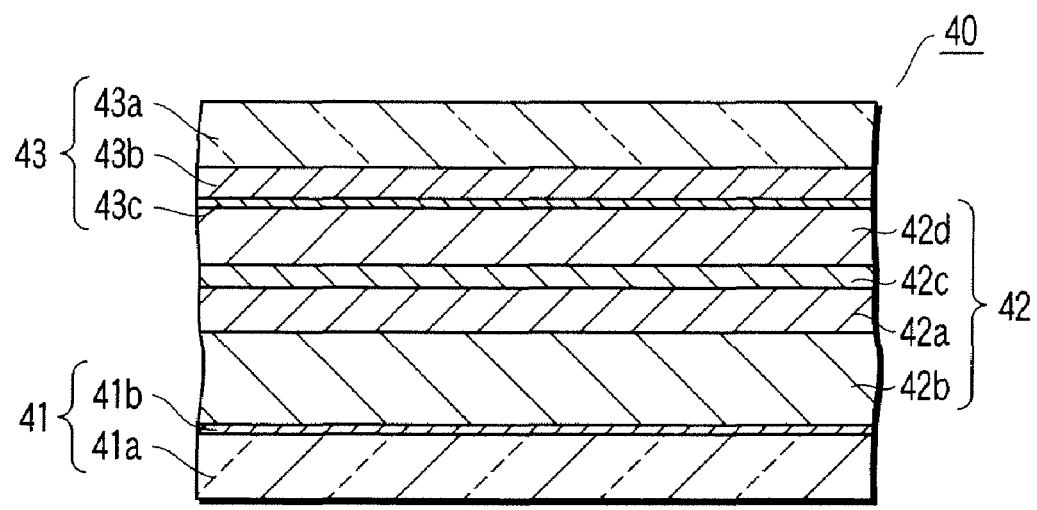
FIG. 6 is a sectional view schematically showing an example of a structure which can be employed for an organic EL element of the organic EL display shown in FIG. 1.
Figure 7:
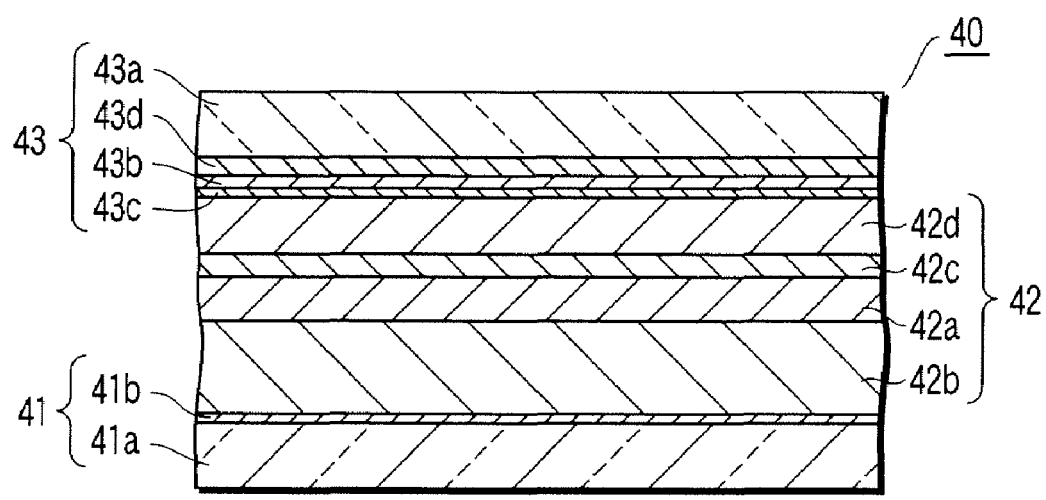
FIG. 7 is a sectional view schematically showing another example of a structure which can be employed for an organic EL element of the organic EL display shown in FIG. 1.

FIG. 6 is a sectional view schematically showing an example of a structure which can be employed for the organic EL element of the organic EL display shown in FIG. 1. FIG. 7 is a sectional view schematically showing another example of a structure which can be employed for the organic EL element of the organic EL display shown in FIG. 1. The organic EL element 40 shown in FIG. 6 and the organic EL element 40 shown in FIG. 7 have the same structure except for the second electrode 43 as a cathode.

In each organic EL element 40 of FIGS. 6 and 7, the first electrode 41 which is an anode includes an ITO layer 41a and an amorphous carbon layer 41b. The thickness of the ITO layer 41 is 50 nm, for example, and the thickness of the amorphous carbon layer 41b is 3 nm, for example.

In the organic EL element 40 of FIGS. 6 and 7, the active layer 42 includes the light emitting layer 42a, a TPT layer 42b, a BAlq layer 42c, and an Alq$_3$ layer 42d. Note that the "TPT" is tetraphenylthiophene, Alq$_3$ is an aluminum complex in which three oxines coordinate with an aluminum atom, and BAlq is obtained by substituting one of quinolate ligands of Al$_{q3}$ by phenolate. For example, the thickness of the light emitting layer 42a is 30 nm, and the thickness of the TPT layer 42b is 90 nm. In addition, for example, the thickness of the BAlq layer is 10 nm, and the thickness of the Al$_{q3}$ layer is 40 nm.

In the organic EL element 40 of FIG. 6, the second electrode 42 which is a cathode includes an ITO layer 43a, an MgAg layer 43b, and an LiF layer 43c. For example, the thickness of the ITO layer 43a is 50 nm, the thickness of the MgAg layer 43b is 10 nm, and the thickness of the LiF layer is 1 nm.

On the other hand, in the organic EL element 40 of FIG. 7, the second electrode 42 which is a cathode includes an ITO layer 43a, an Ag layer 43d, an MgAg layer 43b, and an LiF layer 43c. In the organic element 40 of FIG. 7, for example, the thickness of the ITO layer 43a is 50 nm, the thickness of the Ag layer 43d is 5 nm, the thickness of the MgAg layer 43b is 5 nm, and the thickness of the LiF layer is 1 nm. In this way, the organic EL element 40 of FIG. 7 is different from the organic EL element 40 of FIG. 6 in that the Ag layer 43d is added to the second electrode 42 and the MgAg layer 43b is thinner.

An MgAg alloy is excellent as an electron injection layer. However, the MgAg alloy is comparatively large in light absorption.

In the organic EL element 40 of FIG. 6, if the MgAg layer 43b is thinner, light absorption by the second electrode 43 can be reduced. However, if the MgAg layer 43b is thin, an underlayer below the MgAg layer 43b is damaged when the ITO layer 43a is formed on the MgAg layer.

In the organic EL element 40 of FIG. 7, the Ag layer 43d is placed between the MgAg layer 43b and the ITO layer 43a. Ag is smaller in light absorption as compared with the MgAg alloy. In addition, the Ag layer 43d prevents the undercoat from being damaged when the ITO layer 43a is deposited. That is, when the structure of FIG. 7 is employed, light absorption by the second electrode 43 can be reduced as compared with a case in which the structure of FIG. 6 is employed. Moreover, it becomes possible to prevent the undercoat from being damaged when the ITO layer 43a is deposited.

Such effects can be attained by another method. For example, in the organic EL element 40 of FIG. 6, an Ag content in the MgAg layer 43b may be increased. For example, the Ag content may increased from 7% to 50%. By doing this, light absorption by the second electrode 43 can be reduced.

Note that an amorphous carbon is a material whose light absorption is comparatively large. Therefore, it is desirable that an amorphous carbon layer 41b be thinly formed.

In addition, instead of the MgAg layer, for example, there may be used an organic substance layer doped with an alkaline metal element and/or an alkaline earth metal element, for example. For example, a layer of Alq$_3$ doped with Cs may be used. In this manner, it becomes possible to ensure transparency of a light-transmission electrode.

While the above embodiment has described a case of placing the outcoupling layer on the back side of the organic EL element by way of example, the outcoupling layer may be placed on the front side of the organic EL element.

The outcoupling layer may employ another construction. For example, the outcoupling layer may employ a diffraction grating structure. The display may further include a flattening film for flattening irregularities on a surface of the outcoupling layer.

While the above embodiment has described a top emission structure, a bottom emission structure can be employed. When a bottom emission structure is employed, by using Ag as a material of a light-reflection upper electrode, absorption of light by a layer adjacent to a waveguide layer can be decreased as compared with the case where Al is used as the material.

As has been described above, when the layer adjacent to the waveguide layer is made of a material having low light absorption, attenuation of light in the waveguide layer can be suppressed.

In addition, in a display utilizing a reflection layer, by placing a material whose refractive index is lower than that of an organic layer or a transparent electrode and whose absorption is low between the reflection layer and the transparent electrode, attenuation of light in the waveguide layer can be suppressed.

In addition, by decreasing a thickness of a layer with large absorption coefficient included in the organic layer or by replacing the layer with large absorption coefficient by a transparent layer attenuation of light in the waveguide layer can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic EL display comprising:
   an organic EL element which comprises a first electrode, a second electrode facing the first electrode, and an active layer interposed between the first and second electrodes and including an emitting layer; and
   an outcoupling layer facing the first electrode,
   wherein the organic EL element forms a waveguide layer which includes the first electrode and the active layer and in which light components from the emitting layer propagate in an in-plane direction parallel to a main surface of the waveguide layer while causing multiple-beam interference,
   wherein a distance between the outcoupling layer and the waveguide layer is shorter than a wavelength of light from the organic EL element, and
   wherein a guide length x in μm calculated by using a following equation (1), a number of reflection m calculated by using a following equation (2), an absorption coefficient α in μm$^{-1}$ of the waveguide layer, and an outcoupling efficiency β of the outcoupling layer satisfy a relationship represented by a following inequality (3), where L is a thickness in μm of the waveguide layer, $\theta_i$ is an incident angle at which a light component with the highest intensity emitted by the emitting layer and propagating in the in-plane direction in the waveguide layer while causing multiple-beam interference is incident on a main surface of the waveguide layer facing the outcoupling layer, and the outcoupling efficiency β is a luminous energy ratio of a light component extracted from the waveguide layer with respect to an incident light for a single reflection of the light component with the highest intensity on the main surface of the waveguide layer facing the outcoupling layer, $$x = \frac{L}{\cos\theta_i} \quad (1)$$

$$m = \frac{1}{2}\left(\frac{\ln 100}{\alpha x} + 1\right) \quad (2)$$

$$\beta \sum_{M=1}^{m} \frac{(1-\beta)^{M-1}}{\exp\{\alpha(2M-1)x\}} > 0.1. \quad (3)$$

2. The display according to claim 1, wherein the outcoupling efficiency β is 0.05 or more.

3. The display according to claim 1, wherein the number of reflection m is 5 or more.

4. The display according to claim 1, wherein the number of reflection m is 12 or less.

5. The display according to claim 1, wherein the display is a top emission display, and wherein the outcoupling layer is disposed on a back side of the organic EL element.

6. The display according to claim 1, wherein the display is a top emission display, and wherein the outcoupling layer is disposed on a front side of the organic EL element.

7. The display according to claim 5, wherein the second electrode comprises a conductive oxide layer, an alloy layer which is interposed between the conductive oxide layer and the active layer, and a metal layer which is interposed between the conductive oxide layer and the alloy layer and is smaller in absorptance than the alloy layer.

8. The display according to claim 6, wherein the second electrode comprises a conductive oxide layer, an alloy layer which is interposed between the conductive oxide layer and the active layer, and a metal layer which is interposed between the conductive oxide layer and the alloy layer and is smaller in absorptance than the alloy layer.

9. The display according to claim 5, wherein the second electrode comprises a conductive oxide layer, and wherein the active layer further includes an organic layer which is interposed between the emitting layer and the conductive oxide layer and is doped with alkali metal element and/or alkaline-earth metal element.

10. The display according to claim 6, wherein the second electrode comprises a conductive oxide layer, and wherein the active layer further includes an organic layer which is interposed between the emitting layer and the conductive oxide and is doped with alkali metal element and/or alkaline-earth metal element.

* * * * *